United States Patent [19]

Kuecher et al.

[11] Patent Number: 4,910,580
[45] Date of Patent: Mar. 20, 1990

[54] METHOD FOR MANUFACTURING A LOW-IMPEDANCE, PLANAR METALLIZATION COMPOSED OF ALUMINUM OR OF AN ALUMINUM ALLOY

[75] Inventors: Peter Kuecher, Regensburg; Guenther Roeska, Holzkirchen, both of Fed. Rep. of Germany

[73] Assignee: Siemens Aktiengesellschaft, Berlin and Munich, Fed. Rep. of Germany

[21] Appl. No.: 227,013

[22] Filed: Aug. 1, 1988

[30] Foreign Application Priority Data

Aug. 27, 1987 [DE] Fed. Rep. of Germany ....... 3728662

[51] Int. Cl.[4] .......................................... H01L 23/48
[52] U.S. Cl. .......................................... 357/71; 357/67
[58] Field of Search ................... 357/71, 67; 437/189, 437/190, 192, 194

[56] References Cited

U.S. PATENT DOCUMENTS 4,527,184 7/1985 Fischer .................................. 357/67

FOREIGN PATENT DOCUMENTS 0110401 11/1983 European Pat. Off. .
0199030 3/1986 European Pat. Off. .

Primary Examiner—Andrew J. James
Assistant Examiner—Mark Prenty
Attorney, Agent, or Firm—Hill, Van Santen, Steadman & Simpson

[57] ABSTRACT

To improve the planarization and reliability of low-impedance aluminum metallizations, a substrate provided with a titanium/titanium nitride double layer diffusion barrier layer and having a contact hole is provided or, respectively, filled with an aluminum/silicon alloy sandwich structure composed of a sequence of n aluminum/silicon layers having n−1 intermediate layers of titanium applied thereon, whereby the layer thickness ratio of the titanium intermediate layers to the overall layer thickness d of the metallization behaves like 1:10. The multisandwich metallization manufactured in this way is used in VLSI circuits and, given the same specific resistance achieves a life expectancy that is 10 through 100 times higher than that of the aluminum/silicon/titanium alloys that are otherwise standard.

4 Claims, 2 Drawing Sheets

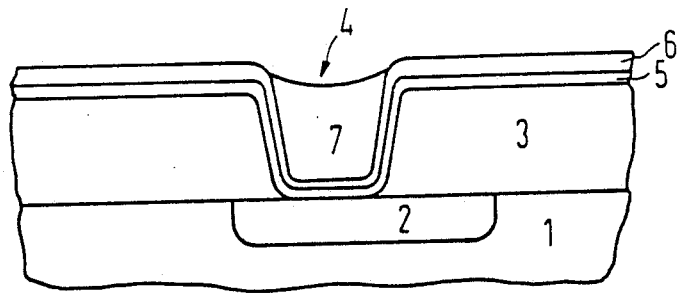
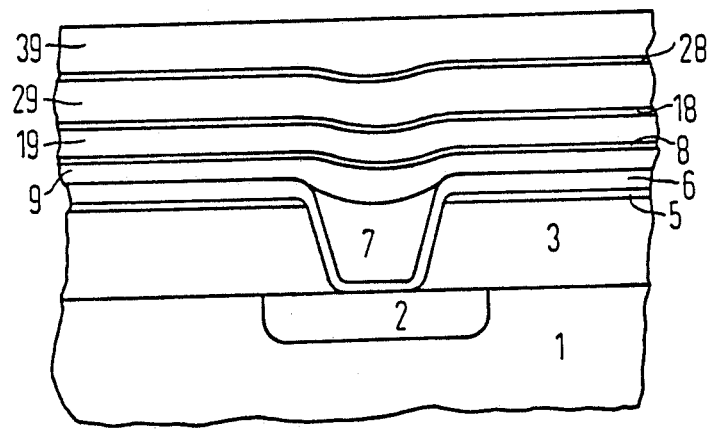

METHOD FOR MANUFACTURING A LOW-IMPEDANCE, PLANAR METALLIZATION COMPOSED OF ALUMINUM OR OF AN ALUMINUM ALLOY

BACKGROUND OF THE INVENTION

The present invention is directed to a method for manufacturing a low-impedance, planar metallization for LSI semiconductor circuits. More particularly, the present invention is directed to a method for manufacturing a low-impedance, planar metallization for LSI semiconductor circuits composed of aluminum or of an aluminum alloy, wherein aluminum is used as a via hole filler and a double layer composed of titanium/titanium nitride is used as a diffusion barrier layer. The present invention also is directed to a low-impedance metallization manufactured pursuant to this method.

As a result of the higher integration of semiconductor circuits (transistors, capacitors) on a chip, the available space for individual elements is constantly decreasing. A multi-layer wiring is therefore also increasingly necessary in MOS circuits in the wiring of VLSI semiconductor circuits. A prerequisite therefor is a planarization of the surface of the individual layer components (insulating oxides, metallization layers).

In order to determine the reliability of the metallization, a number of factors must be considered. The reliability of metallization is determined by the electromigration resistance of the material, the hillock growth (which can lead to short circuits), by mechanical stresses in the layer, by void formation, and by corrosion, as well as, by the edge coverage over the steps and in the via hole.

The present invention provides a method for manufacturing a low-impedance, planarizing wiring with aluminum for filling via holes (i.e., contact holes in insulating layers between two metallization levels) and a sandwich aluminum structure as an interconnect level that meets the requirements of high reliability and can be manufactured with a conventional structuring method.

Aluminum alloy layers such as aluminum/silicon alloys, aluminum/silicon/titanium alloys, aluminum/copper, and aluminum/silicon/copper alloys have been heretofore used for the metallization of integrated circuits. For example, European Patent Application No. 0 110 401 discloses such an aluminum alloy based on an aluminum/silicon/titanium alloy having a part of one percent through two percent by weight of silicon and a titanium additive of less than 0.5% by weight.

European Patent Application No. 0 199 030 discloses a via hole filling method for the manufacture of reliable aluminum contacts, loadable with high current densities, wherein aluminum is used that is deposited surface-wide by low-pressure vapor phase deposition and is etched back again to the level of the via hole. No decrease in the layer thickness in the via hole occurs because of the aluminum fill situated in the via hole, so that a current load is likewise not critical at these locations. There is, however, the risk of aluminum spiking that can lead to substrate shorts.

To improve the planarization and the reliability of low-impedance interconnects of aluminum, German Patent Application No. P36 40 656.2 proposes the use of tungsten as a via hole filler and the use of a metallization pattern as an interconnect layer. The metallization pattern contains a molybden silicide layer and a titanium/titanium nitride double layer as an underlayer, because of the high specific resistance of tungsten and because of the poor bondability and structurability.

Given a high aspect ratio, and unfavorable via hole shape, a polyimide layer must frequently be deposited due to the formation of what are referred to as key holes. The polyimide layer must be etched back again in order to avoid an over-etching of the tungsten in the via hole. Moreover, there is a further disadvantage in that the metallic contact between the aluminum and tungsten is undefined. Furthermore, the tungsten can potentially contain fluorine, due to tungsten hexafluoride, that can lead to aluminum corrosion.

Further, the methods disclosed in European Patent Application No. 0 199 030 and German Patent Application No. P36 40 656.2 suffer a disadvantage due to their starting materials. Both methods, because of the initial materials employed, such as tungsten hexafluoride and triisobutyl aluminum, provide an increased risk during the manufacturing process; due to the high toxicity of tungsten hexafluoride and ignitability of triisobutyl aluminum.

SUMMARY OF THE INVENTION

The present invention provides a method for manufacturing low-impedance, planar metallization for LSI semiconductor circuits that is composed of aluminum or of an aluminum alloy, wherein the aluminum is used as a via hole filler and a double layer composed of titanium/titanium nitride is used as a diffusion barrier layer.

The method comprises the steps of following the deposition of the titanium/titanium nitride double layer onto an arrangement provided with via holes, an aluminum/silicon alloy is deposited by cathode sputtering surface/wide as a via hole fill. The aluminum/silicon alloy is etched back surface/wide, with the titanium/titanium nitride layer on the surface acting as an etching stop. A sequence of layers n composed of aluminum or of an aluminum alloy is applied thereon with titanium as an intermediate layer. Pursuant to the method a plurality of the titanium intermediate layers equal to $n-1$ having a layer thickness ratio of the titanium intermediate layers relative to the overall thickness d of the metallization of 1:10.

In an embodiment of the present invention, the number of titanium intermediate layers is at least 2.

In an embodiment of the present invention, an aluminum/silicon alloy having a silicon content of 1% by weight is used as a via hole filler and for the layer sequence.

In an embodiment of the present invention, the deposition of the metallization sequence proceeds by cathode sputtering.

In an embodiment of the present invention, the reetching process of the aluminum/silicon alloy following the via hole filling is implemented by reactive ion etching in a borotrichloride/chlorine mixture.

The present invention also provides a low-impedance metallization composed of aluminum, silicon, and titanium for LSI semiconductor circuits comprising a titanium/titanium nitride double layer that acts as a diffusion barrier to a silicon substrate. The via hole filler is composed of an aluminum/silicon alloy. A sandwich structure composed of a sequence n of aluminum or aluminum alloy layers having $n-1$ intermediate layers of titanium is arranged on the substrate surface above the titanium/titanium nitride double layer. A plurality of titanium intermediate layers is present, the number of titanium intermediate layers is n−1, and the layer thickness ratio of the n−1 titanium intermediate layers to the overall layer thickness d of the metallization n+(n−1) acts like 1:10.

In an embodiment of the present invention, the metallization has a specific resistance of 3.7μ Ohm cm and given an overall thickness of 700 nm, the layer sequence is composed of four aluminum/silicon layers with three intervening titanium layers each of which is 20 nm thick.

Additional features and advantages of the present invention will be apparent from the drawings and detailed description of the presently preferred embodiments.

BRIEF DESCRIPTION OF THE DRAWINGS

FIGS. 1 through 5 illustrate method steps of the present invention for manufacturing a low-impedance, planar metallization for LSI semiconductor circuits.

DETAILED DESCRIPTION OF THE PRESENTLY PREFERRED EMBODIMENTS

The present invention provides an improved method for manufacturing a low-impedance, planar metallization for semiconductor circuits and low-impedance, metallization composed of aluminum, silicon, and titanium for LSI semiconductor circuits comprising a titanium/titanium nitride double layer that functions as a diffusion barrier to the silicon substrate.

The present invention resolves the object or, respectively, the problem of manufacturing a low-impedance, planarizing wiring with aluminum in a novel way and is characterized in that, after the deposition of the titanium/titanium nitride double layer, an aluminum/silicon alloy is deposited surface/wide by cathode sputtering on the arrangement provided with the via holes. The aluminum/silicon alloy is deposited thereon as a via hole fill, and is etched back surface-wide, whereby the titanium/titanium nitride layer of the surface functions as an etching stop. A sequence of layers n composed of aluminum or of an aluminum alloy with titanium acting as an intermediate layer is subsequently applied. The plurality of titanium intermediate layers equals n−1 and the ratio of the layer thickness of titanium intermediate layers to the overall layer thickness d of the metallization is 1:10. The present invention results in the achievement of life expectancy that is approximately 10 to about 100 times greater than that of an aluminum/silicon/titanium alloy as disclosed, for example, in European Patent Application No. 0 110 401.

In an embodiment of the present invention, the number of titanium intermediate layers (n−1) is at least 2. In an embodiment of the present invention, given an overall layer thickness d of the metallization of approximately 700 nm, the layer thickness of the individual titanium intermediate layer is at least 10 nm and at most $$\frac{d}{10(n-1)} nm.$$

It has been found that a reduction in the thickness of the individual titanium layer leads to a breakage of the intermediate layers. It has also been found that an enlargement in the thickness of the individual titanium layers leads to a significant increase in the specific resistance and to problems in the structuring. Although, a lowering in the number of intermediate layers in fact increases the electromigration resistance of the interconnect under constant current conditions, it involves a noticeable shortening of the electromigration resistance given load experiments under permanent temperature changes that occur given turn-on and turn-off events of integrated circuits.

Referring now to the Figures, the method of the present invention for manufacturing an aluminum metallization system, that is especially suited for VLSI circuits, will now be described.

Figure 1:
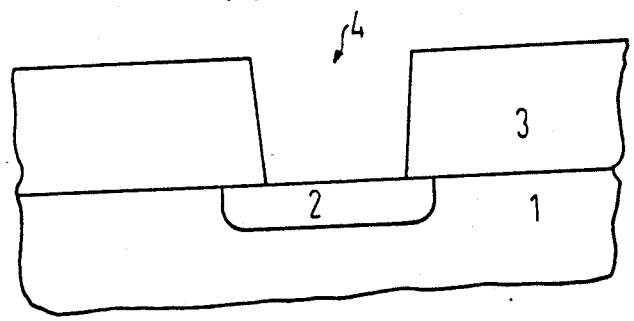

Referring to FIG. 1, a $SiO_2$ layer that functions as an insulation layer is applied to a silicon substrate 1. An $n^+$-doped zone 2 (well), to be contacted, is located on the silicon substrate 1. A via hole 4 having a diameter of about 0.9 um is etched into the $SiO_2$ layer 3 in the region of the doped zone 2.

Figure 2:
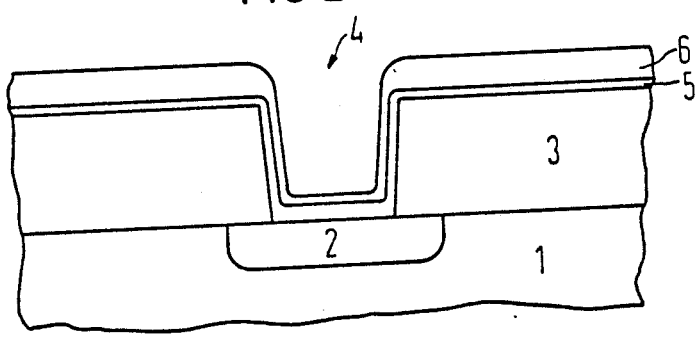

Referring now to FIG. 2, in the first metallization level, the via holes having a high aspect ratio and a small via hole diameter must exhibit a good edge coverage of metallization and a high reliability, i.e., a good electro-migration resistance must be present and the hillock density and size should be diminished. Hillock growth can cause intermetallic shorts. In the step illustrated in FIG. 2, first, a barrier layer 5, 6 of, for example, a titanium (5)/titanium nitride (6) double layer is deposited onto the arrangement 1, 2, 3, and 4. The double layer also acts as an etching stop for the re-etching of the aluminum/silicon alloy (7) that occurs later in the process. The layer 5, 6 produces a low-impedance contact to the doped zone 2 and simultaneously produces a diffusion barrier to the silicon 2 in later temperature steps.

Figure 3:
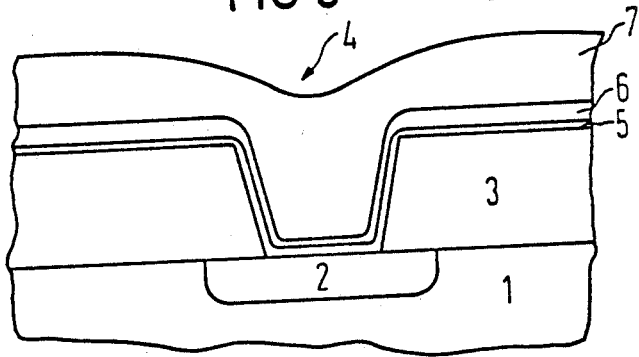

Referring now to FIG. 3, a planarizing sputtering process follows by means of which an aluminum/silicon alloy 7, having a part of one percent by weight of silicon, is applied surface-wide, covering the via hole 4. As a consequence of the high deposition rate, process temperatures of about 500° C. are reached for only approximately 10 to about 20 seconds in contrast to aluminum deposition which proceeds from the vapor phase by thermic decomposition of, for example, triisobutyl aluminum. Materials or alloys having a low melting point can also be utilized in the method set forth herein, these materials are easy to structure with reactive ion etching. The sputtering proceeds, for example, upon use of a sintered target.

As illustrated in FIG. 4, the aluminum/silicon layer 7 present on the surface is etched back until only the via hole 4 remains filled with the aluminum/silicon alloy 7. Known etching processes with borotrichloride and chlorine can thereby be utilized. In contrast to a filling of the via hole with tungsten deposited from the vapor phase (employment of tungsten hexafluoride), no system transfer is required for the planarizing deposition on the basis of cathode sputtering and subsequent reetching given the aluminum/silicon. Moreover, the titanium/titanium nitride double layer 5, 6 functions as an etching stop.

Referring now to FIG. 5, in a further step of the process, a highly migration-resistant multi-sandwich metallization of aluminum or of an aluminum alloy, preferably aluminum having one percent silicon by weight, and titanium is applied. In the illustrated embodiment the multi-sandwich metallization, given an overall layer thickness of 700 nm, is composed of three titanium intermediate layers 8, 18, 28 each 20 nm thick and of four aluminum/silicon layers 9, 19, 29, 39. The specific resistance of the metallization amounts to about 3.7 μOhm cm and is thus no greater than that of a migration-resistant aluminum alloy having 1% silicon and 0.2% titanium as disclosed, for example, in European Patent Application No. 0 110 401. The multi-sandwich interconnect produced pursuant to the method of the present invention, however, has a life expectancy that is approximately 10 to about 100 times greater. What is important in the configuration of the present invention is that the geometrical corollations, i.e. the plurality of titanium intermediate layers and the thickness relationship relative to the overall layer thickness d, are observed given a modified overall layer thickness as well.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. A low-impedance metallization composed of aluminum, silicon and titanium for LSI semiconductor circuits comprising: a titanium/titanium nitride double layer that acts as a diffusion barrier to a silicon substrate; a via hole and a via hole filler composed of an aluminum/silicon alloy; and a sandwich structure composed of an alternating sequence of n aluminum or aluminum alloy layers and n−1 layers of titanium, the sandwich structure being arranged on the substrate surface above the titanium/titanium nitride double layer, the number of titanium intermediate layers being equal to n−1 and the layer thickness ratio of each of the n−1 titanium intermediate layers to the overall thickness of the sandwich structure is approximately 1:10, wherein n is a whole number.

2. The low-impedance metallization of claim 1 having a specific resistance of 2.7μ Ohm cm and the sandwich structure having a layer thickness of 700 nm, the layer sequence being composed of four aluminum/silicon layers with three intervening titanium layers each of which is 20 nm thick.

3. The low-impedance metallization of claim 1 wherein there are at least two titanium intermediate layers.

4. The low-impedance metallization of claim 1 wherein the aluminum/silicon alloy contains approximately 1% silicon by weight.

* * * * *